United States Patent

Baum et al.

[11] Patent Number: 5,919,522
[45] Date of Patent: Jul. 6, 1999

[54] GROWTH OF BASRTIO$_3$ USING POLYAMINE-BASED PRECURSORS

[75] Inventors: Thomas H. Baum, New Fairfield; Gregory T. Stauf, New Milford; Peter S. Kirlin, Newtown, all of Conn.; Duncan W. Brown, La Jolla, Calif.; Robin A. Gardiner, Bethel; Gautam Bhandari, Danbury, both of Conn.; Brian A. Vaartstra, Nampa, Id.

[73] Assignee: Advanced Technology Materials, Inc., Danbury, Conn.

[21] Appl. No.: 08/835,768

[22] Filed: Apr. 8, 1997

Related U.S. Application Data

[63] Continuation-in-part of application No. 08/484,654, Jun. 7, 1995, which is a continuation-in-part of application No. 08/414,504, Mar. 31, 1995, Pat. No. 5,820,664.

[51] Int. Cl.$^6$ .................................................. C23C 16/00
[52] U.S. Cl. ..................................... 427/248.1; 427/255.1; 427/255.2
[58] Field of Search ............................ 427/248.1, 255.1, 427/255.2

[56] References Cited

U.S. PATENT DOCUMENTS

| | | |
|---|---|---|
| 5,204,314 | 4/1993 | Kirlin et al. . |
| 5,453,494 | 9/1995 | Kirlin et al. ............................. 534/15 |
| 5,504,195 | 4/1996 | Leedham et al. ......................... 534/15 |
| 5,536,323 | 7/1996 | Kirlin et al. . |

OTHER PUBLICATIONS

Van Buskirk et al, "Manufacturing of Perovskite Thin Films Using Liquid Delivery MOCVD", Integr. Ferroelectr., 10(1–4), 9–22 (English) 1995.

Beach et al, "MOCVD of Very Thin Films of Lead Lanthanum Titanate", Mater. Res. Soc. Symp. Proc. (1996) 415 (Metalorganic Chemical Vapor Deposition of Electronic Ceramics II) Abstract.

Zhang, et al., Appl. Phys. Lett., 54,1166 (1989).

Bhandari, et al., "Comparison of (L)M(thd)$_2$(M=Mg, Ca, Sr, Ba; L–Tetraglyme, PMDETA) Precursors for High K Dielectric MOCVD", MRS Symposium Proceedings, Fall 1996, Materials Research Society Meeting, p. 1–p. 6.

*Primary Examiner*—Roy V. King
*Attorney, Agent, or Firm*—Steven J. Hultquist; Oliver A. M. Zitzmann

[57] ABSTRACT

A method of forming a thin film of BaSrTiO$_3$ on a substrate in a chemical vapor deposition zone, with transport of a metal precursor composition for the metal-containing film to the chemical vapor deposition zone via a liquid delivery apparatus including a vaporizer. A liquid precursor material is supplied to the liquid delivery apparatus for vaporization thereof to yield the vapor-phase metal precursor composition. The vapor-phase metal precursor composition is flowed to the chemical vapor deposition zone for deposition of metal on the substrate to form the metal-containing film. The liquid precursor material includes a metalorganic polyamine complex, the use of which permits the achievement of sustained operation of the liquid delivery chemical vapor deposition process between maintenance events, due to the low decomposition levels achieved in the vaporization of the polyamine-complexed precursor.

22 Claims, 8 Drawing Sheets

GROWTH OF BASRTIO₃ USING POLYAMINE-BASED PRECURSORS

CROSS-REFERENCE TO RELATED APPLICATIONS

This is a continuation-in-part of U.S. patent application Ser. No. 08/484,654 filed Jun. 7, 1995 in the names of Robin A. Gardiner et al., which in turn is a continuation-in-part of U.S. patent application Ser. No. 08/414,504 filed Mar. 31, 1995, now U.S. Pat. No. 5,820,664 in the names of Robin A. Gardiner et al.

GOVERNMENT RIGHTS IN INVENTION

This invention was made with Government support under Contract NAS3-27825 awarded by the United States Ballistic Missile Defense Organization (BMDO). The Government has certain rights in this invention.

BACKGROUND OF THE INVENTION

1. Field of the Invention

This invention relates generally to a method of growth of Group II metal-containing films, e.g., films of barium strontium titanate (BST) and other Group II metal (Ba, Sr, Ca, Mg) oxide films, using polyamine precursors. The invention contemplates novel precursors of such type.

2. Description of the Related Art

Many materials are utilized in the form of thin films on substrates and are formed by vapor deposition techniques. Examples include refractory materials such as high temperature superconducting (HTSC) materials including $YBa_2CU_3O_x$, wherein x is from about 6 to 7.3, BiSrCaCuO, and TlBaCaCuO. Barium titanate, $BaTiO_3$, and barium strontium titanate, $Ba_xSr_{1-x}TiO_3$, have been identified as ferroelectric and photonic materials with unique and potentially very useful properties in thin film applications of such materials. $Ba_xSr_{1-x}Nb_2O_6$ is a photonic material whose index of refraction changes as a function of electric field and also as a function of the intensity of radiated light. The Group II metal fluorides, $BaF_2$, $CaF_2$, and $SrF_2$, are useful for scintillation detecting and coating of optical fibers.

Many of the potential applications of these materials require their use in thin film, coating, or layer form. The films or layers may also be advantageously epitaxially related to the substrate upon which they are formed. Applications in which materials may need to be deposited in film or layer form include integrated circuits, switches, radiation detectors, thin film capacitors, holographic storage media, and various other microelectronic optical and communication devices.

Chemical vapor deposition (CVD) is a particularly attractive method for forming these layers because it is readily scaled up for production. Further, the electronic industry has extensive experience and an established CVD equipment base that can be applied to new CVD processes. In general, the control of key variables such as stoichiometry and film thickness, and the coating of a wide variety of substrate geometries is possible with CVD.

Forming the thin films by CVD will permit the integration of these materials into existing device production technologies. CVD also permits the formation of layers of materials that are epitaxially grown on substrates having close crystal structures and lattice parameters.

CVD requires that the element source reagents, i.e., the precursor compounds and complexes containing the elements or components of interest, must be sufficiently volatile to permit gas phase transport into the chemical vapor deposition reactor. The elemental component source reagent must decompose in the CVD reactor to deposit only the desired element at the desired growth temperatures. Premature gas phase reactions leading to particulate formation must not occur, nor should the source reagent decompose in the lines before reaching the reactor deposition chamber. When compounds are decomposed for deposition, obtaining optimal properties requires close control of stoichiometry which can only be achieved if the reagent can be delivered into the reactor in a controllable fashion. In this respect the reagents must not be so chemically stable that they are non-reactive in the deposition chamber.

Desirable CVD reagents, therefore, are fairly reactive and volatile. Unfortunately, for many of the materials described above, volatile reagents do not exist. Many potentially highly useful refractory materials have in common that one or more of their components are Group II elements, i.e., the metals barium, calcium, strontium, or magnesium, for which no or few volatile compounds well-suited for CVD are known. In many cases, the source reagents are solids whose sublimation temperature is very close to the decomposition temperature, in which case the reagent may begin to decompose in the lines before transport to the reactor, and it therefore is very difficult to control the stoichiometry of the deposited films from such decomposition-susceptible reagents.

In other cases, the CVD reagents are liquids, but their delivery into the CVD reactor in the vapor phase has proven impractical because of problems of premature decomposition or stoichiometric control.

When the film being deposited by CVD is a multicomponent substance rather than a pure element, such as barium titanate or the oxide superconductors, controlling the stoichiometry of the film is critical to obtaining the desired film properties, such as for example optical or electrical properties. In the deposition of such materials, which may form films with a wide range of stoichiometries, the controlled delivery of known proportions of the source reagents into the CVD reactor chamber is essential.

While source reagent liquid delivery systems present distinct advantages over conventional techniques, there is often some fraction of the precursor compound that decomposes into very low volatility compounds that remain in the vaporization zone. This deficiency is an important issue in the operation of CVD processes that use thermally unstable solid source precursors which undergo significant decomposition at conditions needed for sublimation. Such decomposition can occur in all reagent delivery systems that involve a vaporization step, including flash vaporizer liquid delivery systems, as well as more conventional reagent delivery systems that include bubblers and heated vessels operated without carrier gas(es).

Although well-behaved CVD precursors vaporized under "ideal" conditions will form no deposits or residue at the vaporization zone, deviations from this situation are common and can be divided into several categories:

1) Reactive impurities in either the precursor or in the carrier gas decompose at the vaporizer temperatures.

2) Spatial and temporal temperature variations occur in the vaporization zone, with temperatures in some regions being sufficient to facilitate decomposition.

3) CVD precursors are employed which are thermally unstable at the sublimation temperature.

Optimization of the conditions used in the vaporizer of reagent delivery systems can minimize the fraction of the delivered precursor that decomposes (and remains) in the vaporization zone, but virtually all solid and liquid precursors undergo some decomposition when they are heated for transport to the gas phase. This fraction is negligibly small in "well-behaved" precursor compounds. Use of precursors that tend to decompose near their vaporization temperature may be mandated by availability (i.e., where the selected precursor possesses the best properties of available choices) or by economics, where precursor cost is strongly dependent on the complexity of its synthesis and molecular structure.

Additionally, CVD precursors often contain impurities, and the presence of those impurities can cause undesirable thermally activated chemical reactions in the vaporization zone, also resulting in the formation of involatile solids, liquids and oligomers/polymers at that location. For example, a variety of CVD precursors (such as tantalum pentaethoxide) are water-sensitive and hydrolysis can occur at the heated vaporizer zone forming tantalum oxide particulates that may be incorporated into the growing tantalum oxide film with deleterious effects or induce problems in the delivery or vaporization zones.

Despite the advantages of the liquid delivery approach (which include improved precision and accuracy for most liquid and solid CVD precursors and higher delivery rates), the foregoing deficiencies pose a serious impediment to widespread use of the vaporization liquid delivery technique for providing volatilized reagent to the CVD reactor and full-scale manufacturing of electronic components.

The foregoing problems have specifically been experienced in the development of high density memories using high dielectric constant and ferroelectric materials. In addition to high density memories, ferroelectric materials are attractive candidates in a wide variety of solid state sensors and imaging devices, as a consequence of their pyroelectric and piezoelectric properties. Production worthy deposition modules are needed to realize the potential of high dielectric constant and ferroelectric materials in evolving semiconductors. The preferred method for production of films of these materials is MOCVD, but at present a full complement of stable liquid source reagents is not commercially available for many thins films of interest, such as $BaSrTiO_3$ (BST) and $SrBi_2Ta_2O_9$ (SBT).

The vaporization of solid Group II source reagents such as those used in the MOCVD of these materials presents additional difficulties. First, non-fluorinated source reagents may undergo some decomposition during vaporization. Oligomerization or polymerization may accompany decomposition and cause the effective transport rate of the source reagent to drop much more rapidly than expected based on the amount of decomposed material. This phenomenon is not reproducible and is one of the reasons that many groups have designed their CVD tools to allow a fresh charge of precursor(s) before each run. See, for example, J. M. Zhang, J. Zhao, H. O. Marcy, L. M. Tonge, B. M. Wessels, T. J. Marks, and C. R. Kannewurf, *Appl. Phys. Lett.*, 54, 1166 (1989). Fluorinated precursors are undesirable because fluorine is an anionic dopant which requires temperatures in excess of 800° C. in the presence of water to remove it. Fluorinated precursor processes are potentially destructive for ULSI devices, particularly the storage node, and measured leakage currents of MOCVD films grown with fluorinated precursor reagents at temperatures below 700° C. have been unacceptable. The use of a liquid delivery system overcomes some of these problems, but does not completely eliminate decomposition residue (in every case) during flash vaporization.

Second, the Group II source reagent materials do not have high vapor pressures, so all sections of the reactor between the vaporization point and any trap used to remove undecomposed precursor before the vacuum pump must be heated. This brings considerable added complexity and expense to the reactor design. In particular, cost and complexity rise steeply with increase of required temperatures from around 180° C. to 240° C. This is because elastomer vacuum seals cannot withstand temperatures above the 200–220° C. range, and therefore metal seals must be used. The development of precursors which can be vaporized and will not condense on reactor walls at lower temperatures would entail significant commercial advantages for the commerical production of Group II element-containing films such as BST.

Improved liquid delivery systems are disclosed in U.S. Pat. No. 5,204,314 issued Apr. 20, 1993 to Peter S. Kirlin et al. and U.S. Pat. No. 5,536,323 issued Jul. 16, 1996 to Peter S. Kirlin et al., which describe heated foraminous vaporization structures such as microporous disk elements. In use, liquid source reagent compositions are flowed onto the foraminous vaporization structure for flash vaporization. Vapor thereby is produced for transport to the deposition zone, e.g., a CVD reactor. The liquid delivery systems of these patents provide high efficiency generation of vapor from which films may be grown on substrates. Such liquid delivery systems are usefully employed for generation of multicomponent vapors from corresponding liquid reagent solutions containing one or more precursors as solutes, or alternatively from liquid reagent suspensions containing one or more precursors as soluble suspensions.

The art continues to seek improvements in liquid delivery systems for vapor-phase formation of advanced materials, as well as improvements in process conditions and techniques for operating the liquid delivery system and ancillary equipment in a maximally efficient manner.

Accordingly, it is an object of the present invention to provide new Group II precursor compositions which are usefully employed in liquid delivery MOCVD processes for the formation of Group II metal-containing films.

It is another object of the invention to provide new precursor compositions for the formation of ferroelectric films, such as SBT and high dielectric constant materials, such as BST.

It is a still further object of the invention to provide an efficient liquid delivery process for the formation of Group II metal-containing films such as BST films.

Other objects and advantages of the invention will be more fully apparent from the ensuing disclosure and appended claims.

SUMMARY OF THE INVENTION

The present invention in one aspect relates to a method of forming a barium- and/or strontium-containing film on a substrate from corresponding precursor(s), comprising liquid delivery and flash vaporization thereof to yield a precursor vapor, and transporting the precursor vapor to a chemical vapor deposition reactor for formation of a corresponding barium- and/or strontium-containing film on the substrate, wherein the precursor(s) have the formula:

$MA_yX$ wherein:

M is barium or strontium;

A is a monodentate or multidentate organic ligand coordinated to M which allows complexing of $MA_y$ with X;

y is an integer having a value of 2, 3 or 4;

each of the A ligands may be the same or different; and

X is a monodentate or multidentate amine or polyamine ligand coordinated to M.

The film in the method described above may for example be $Ba_xSr_{1-x}TiO_3$ wherein x is from 0 to 1, inclusive. The film therefore may be barium strontium titanate, in which the foregoing method additionally comprises liquid delivery, flash vaporization and transport of a titanium precursor, such as an alkoxide β-diketonate titanium precursor, as for example $Ti(OiPr)_2(thd)_2$.

A in the foregoing formula $MA_yX$ may be selected from the group consisting of β-diketonates, β-thioketonates, cyclopentadienyls, alkyls, perfluoroalkyls, alkoxides, perfluoroalkoxides, and Schiff bases. Examples include:

(i) 2,2,6,6-tetramethyl-3,5-heptanedionate;

(ii) 1,1,1,5,5,5-hexafluoro-2,4-pentanedionate;

(iii) 1,1,1,2,2,3,3-heptafluoro-7,7-dimethyl-4,6-octanedionate;

(iv) cyclopentadienyl;

(v) 4,4'-(ethane-1,2-diyldiimino) bis (3-pentene-2-one);

(vi) pentamethylcyclopentadienyl and other substituted cyclopentadienyls;

(vii) 2,4-pentanedionate; and (viii) 1,1,1-trifluoro-2,4-pentanedionate; and (ix) 2,2,7-trimethyl-3,5-octanedionate.

X in the foregoing formula may be a polyamine, such as polyamines selected from the group consisting of pentamethyldiethylenetriamine (PMDETA), diethylenetriamine (DETA), tetraethylenepentaamine (TEPA) and hexamethyltetraethylene-pentaamine (HMTEPA).

The metalorganic complex $MA_y$ or $MA_yX$ in the above-described general method may be dissolved in a solution of organic solvent and polyamine, and the complexing of the coordinated precursor may occur in situ with $MA_y$ complexing with the polyamine in the organic solvent to yield $MA_yX$.

In another aspect, the invention relates to a method of forming a barium- and/or strontium-containing film on a substrate from corresponding precursor(s), comprising the steps of:

providing the precursor(s) in a solvent or suspending agent therefor, as a liquid reagent composition comprising the precursor(s) and the solvent or suspending agent;

vaporizing the liquid reagent composition to yield a precursor vapor, and transporting the precursor vapor to a chemical vapor deposition reactor having the substrate therein; and depositing a corresponding barium- and/or strontium-containing film on the substrate, wherein the precursor(s) have the formula:

$MA_yX$ 

wherein:

M is barium or strontium;

A is a monodentate or multidentate organic ligand coordinated to M which allows complexing of $MA_y$ with X;

y is an integer having a value of 2, 3 or 4;

each of the A ligands may be the same or different; and

X is a monodentate or multidentate amine or polyamine ligand coordinated to M.

As applied to the Group II metals, M in the above formula $MA_yX$ may be a metal such as Ba, Sr, Ca, Mg, etc., but the above-described liquid delivery and chemical vapor deposition method is not limited in such respect. More generally, the liquid delivery and chemical vapor deposition method may be applied to any suitable metal species M, including metals of the group consisting of Cu, Ba, Sr, La, Nd, Ce, Pr, Sm, Eu, Th, Gd, Tb, Dy, Ho, Er, Tm, Yb, Lu, Bi, Tl, Y, Pb, Ni, Pd, Pt, Al, Ga, In, Ag, Au, Co, Rh, Ir, Fe, Ru, Sn, Li, Na, K, Rb, Cs, Ca, Mg, Ti, Zr, Hf, V, Nb, Ta, Cr, Mo, and W.

The present invention relates in another aspect to metal β-diketonate polyamine adducts useful in liquid delivery to CVD reactors for the deposition of metal-containing films from such adducts as metal source precursor reagents.

In a further aspect, the invention relates to barium and strontium β-diketonate Group II polyamine adducts useful in the chemical vapor deposition growth of $BaSrTiO_3$ thin films.

In another aspect, the present invention relates to a process for the formation of BST thin films, in which precursor complexes are used as source reagents for Ba and Sr, comprising β-diketonate polyamine adducts of Ba and Sr, respectively.

The present invention is a significant improvement over the prior conventional use of corresponding β-diketonate tetraglyme adducts of Ba and Sr for formation of BST thin films via liquid delivery MOCVD techniques. For example, by combining barium bis(2,2,6,6-tetramethyl-3,5-heptanedionate) and strontium bis(2,2,6,6-tetramethyl-3,5-heptanedionate) with a polyamine type coordination ligand (Lewis base), rather than tetraglyme as the complexing ligand, transport of the reagent is significantly improved at lower temperatures. This improvement is attributable to the formation of a more stable adduct than is the case with tetraglyme-complexed Ba and Sr β-diketonates.

Other aspects and features of the invention will be more fully apparent from the ensuing disclosure and appended claims.

DETAILED DESCRIPTION OF THE INVENTION AND PREFERRED EMBODIMENTS THEREOF

The disclosures of the following United States Patents and United States patent applications are hereby incorporated herein by reference in their entirety: U.S. patent application Ser. No. 08/484,025 filed Jun. 7, 1995 in the names of Peter S. Kirlin, et al.; U.S. Pat. No. 5,204,314 issued Apr. 20, 1993 to Peter S. Kirlin et al.; U.S. Pat. No. 5,536,323 issued Jul. 16, 1996 to Peter S. Kirlin et al., U.S. patent application Ser. No. 08/484,654 filed Jun. 7, 1995 in the names of Robin A. Gardiner et al., and U.S. patent application Ser. No. 08/414,504 filed Mar. 31, 1995 in the names of Robin A. Gardiner et al.

Thermogravimetric analysis permits one to examine the weight loss of the precursor as a function of temperature. In conventional practice, thermogravimetric analysis (TGA) plots of precursor materials have been used as an indicator of the suitability and efficacy of such materials for transport and deposition in chemical vapor deposition.

For thermogravimetric analysis of organometallic precursors complexed (adducted) with a Lewis base, the first weight loss observed in the TGA plot with increasing temperature indicates loss of the Lewis base ligand, followed by volatilization of the precursor with increasing temperature.

Figure 1:
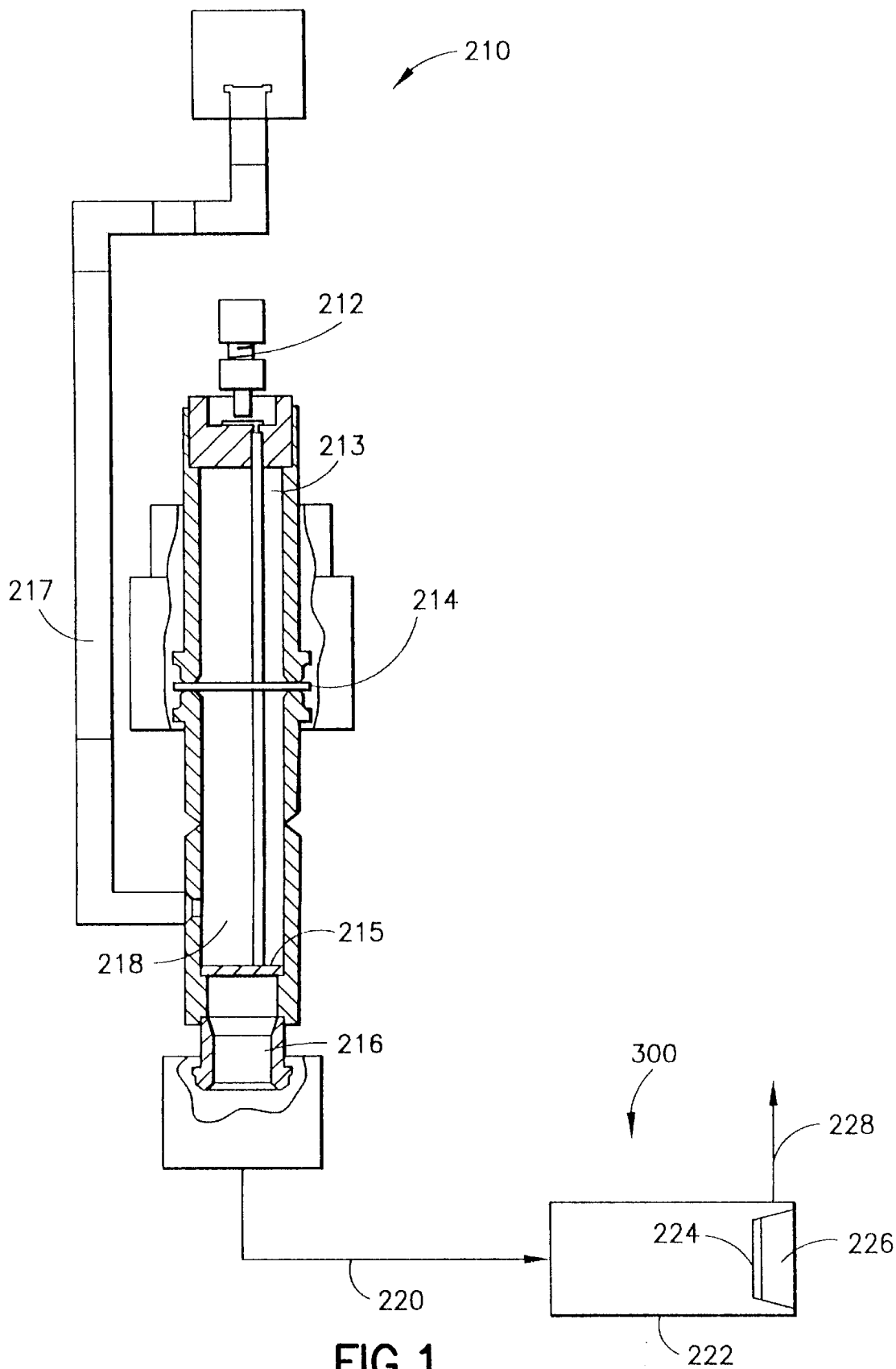
FIG. 1 is a schematic representation of a liquid delivery system and associated chemical vapor deposition reactor, such as may be employed in the chemical vapor deposition growth of $BaSrTiO_3$ thin films in accordance with the present invention.

FIG. 1 depicts the TGA plot of non-adducted $[Ba(thd)_2]_4$, a tetraglyme adduct of $Ba(thd)_2$, and a polyamine adduct of $Ba(thd)_2$. The lower temperature initial weight loss characteristic of the polyamine adduct in FIG. 1 in relation to the onset of initial weight loss for the tetraglyme Ba β-diketonate, suggests that the polyamine adduct of the barium β-diketonate is inferior as a precursor in relation to the corresponding tetraglyme adduct.

Contrary to such expectation, however, it has been surprisingly found that the polyamine adduct of the barium β-diketonate compound in fact is markedly superior to the corresponding tetraglyme adduct. The polyamine adducts of the present invention have been found to have a significantly higher robustness of vaporization, and vaporize without significant decomposition, in relation to the tetraglyme adducts. The polyamine adducts have also been found to vaporize in a more favorable temperature window, at significantly lower temperatures than heretofore employed with tetraglyme adducts. Such lower temperature operation avoids the condensation problems typically associated with lower temperature operation so that condensation and decomposition products do not aggregate on the internal surfaces of the vapor deposition reactor and therefore do not interfere with subsequent vapor deposition.

In general, the deposition of decomposition products and condensation products on the internal surfaces of the reactor provide a source of revolatilized material which can alter the stoichiometric incorporation of the desired component from the precursor introduced to the reactor from the stoichiometry desired. Further, such deposition on the wall surfaces of the reactor may necessitate rigorous cleaning procedures in order to assure the reactor is usefully employed in subsequent deposition operation, which may use other or different precursors for the formation of other film materials. Such deposition of condensate and decomposition products on the internal surfaces of the chemical vapor deposition reactor necessitate frequent outages of the reactor equipment and ancillary apparatus, for maintenance of the reactor system. In addition, the "clean" and complete volatilization of the polyamine adducted precursor at temperatures below 200° C. allows, for the first time, a vaporizer with Viton® seals to be employed for vaporization of the precursor, thereby substantially reducing the cost of the vaporizer and greatly simplifying the manufacturing operation.

The various difficulties of prior art operation are avoided or at least substantially reduced in the practice of the present invention, by the use of the polyamine adducts of the invention, in lieu of the tetraglyme adducts of the prior art. Accordingly, the polyamine adducts of the present invention present a substantial improvement in the art, and achieve a significant improvement in on-stream operation time between maintenance events.

Referring now to the drawings, FIG. 1 shows a schematic representation of a liquid delivery system 210 and associated CVD reactor 300 which may be usefully employed in the practice of the present invention, for formation of metal-containing oxide films using the polyamine adducts of the present invention.

The delivery system 210 is arranged for flash vaporizing a source reagent comprising a polyamine-complexed metal β-diketonate adduct in accordance with the invention. In this delivery system, a liquid reagent or reagent solution comprising such polyamine-complexed metal b-diketonate adduct is pumped through fitting 212 into tube 213, from which it flows onto porous frit 215 which is heated to a temperature sufficient to flash vaporize the reagent. Reagent vapor then flows downstream to the chemical vapor deposition (CVD) reactor 300 via port 216, from which the reagent vapor is discharged in line 220 to the CVD reactor. The reactor comprises a reactor chamber 222 and a wafer or other substrate element 224 on the substrate heater mount 226. The reagent vapor from line 222 may be flowed toward the substrate element 224 using suitable nozzle or disperser means (not shown) such as a showerhead assembly, for deposition of the desired metal component of the reagent vapor on the substrate element, and with waste gas being discharged from the CVD reactor chamber 222 in exhaust line 228 for subsequent treatment of the waste gas.

Inert carrier gas, such as helium, nitrogen or argon, is flowed into liquid delivery system chamber 218 via tube 217. The inner diameter and length of tube 213 can be varied in order to control the pressure drop between fitting 212 and the downstream reactor. It is desirable to hold the pressure drop constant so that the rate of pumping reagent into the system can be used to control the rate of reagent delivery into the reactor. The inner diameter of tube 213 can range from $1 \times 10^{-4}$ to $20 \times 10^{-4}$ inches, preferably $4 \times 10^{-4}$ to $10 \times 10^{-4}$ inches. The number of these tubes can range from 1 to 3. The type of pump used can be of any kind capable of delivering a constant stream of reagent liquid or liquid injection. Piston pumps of the type used in high performance liquid chromatography are suitable.

The heated vaporizer element 215 may be made of any material that is inert in the presence of the reagents at the appropriate temperatures. Stainless steel, glass, and ceramics are suitable materials of construction. The vaporization element may for example comprise a frit having a pore size of from 2 to 200 mm, with 10 to 100 mm being preferred. A gasket 214 enables the system to be disassembled easily for cleaning.

The vaporizer chamber of the liquid delivery system may be operated in any appropriate manner with reference to the process conditions (temperatures, pressures, flow rates and compositions) employed. For example, it may be desirable to operate the vaporizer of the liquid delivery system with a pre-operation flush with a suitable solvent, so that prior to the active on-stream operation of the vaporizer, the vaporizer chamber is flushed with a once-through flow or recirculated flow of flush medium, for sufficient time to remove decomposition products of reagent delivery, if and to the extent present in the liquid delivery and vaporization system.

Such arrangement allows the deployment of a heated solvent to warm the interior surfaces of the vaporizer to at least part of the elevated temperature rise desired for active operation. Concurrently, the flush medium permits a thorough cleaning of the liquid delivery system, so that the system does not need to be brought to temperature with the flow-through of valuable reagent, which then must be vented to exhaust from the CVD process facility.

The vaporization matrix in the liquid delivery system may be provided in a structural form which can be widely varied, depending on the nature of the liquid containing the polyamine-complexed metal β-diketonate adduct to be flash vaporized thereon, and the operating conditions and end use application for the specific polyamine-complexed reagent material of interest. Thus, for example, the flash vaporization matrix structure could comprise a permeable housing or "cage" filled with tiny particulate packing elements providing extending surface area, for flash vaporization of reagent source liquid solution introduced thereonto when the packing material is maintained at elevated temperature.

Alternatively, the structure of the flash vaporization matrix may embody a wick element serving to draw reagent source liquid onto its surfaces from an associated liquid feed conduit by capillary action.

Accordingly, the flash vaporization matrix structure may in practice comprise any suitable physical element(s) which are arranged to receive a liquid reagent containing the polyamine adduct and to vaporize the received liquid when the physical element(s) are heated to a sufficiently high flash vaporization temperature for the specific liquid employed.

In this respect, although primarily described herein in application to the formation of a Group II metal-containing film on a substrate, with liquid delivery of the polyamine-coordinated metal precursor compound and chemical vapor deposition from the corresponding vapor in a chemical vapor deposition zone, the method of the invention is not thus limited, and encompasses the formation of other metal-containing films, including metals such as Cu, Ba, Sr, La, Nd, Ce, Pr, Sm, Eu, Tb, Gd, Tb, Dy, Ho, Er, Tm, Yb, Lu, Bi, Tl, Y, Pb, Ni, Pd, Pt, Al, Ga, In, Ag, Au, Co, Rh, Ir, Fe, Ru, Sn, Li, Na, K, Rb, Cs, Ca, Mg, Ti, Zr, Hf, V, Nb, Ta, Cr, Mo, and W, from corresponding metal precursor compositions.

In the liquid delivery and chemical vapor deposition system shown in FIG. 1, the flash vaporization matrix structure may be maintained at suitably high elevated temperature to effect flash vaporization of the reagent source liquid thereon in any suitable manner. For example, the matrix structure may be maintained at elevated temperature by virtue of convective heat transfer from an elevated temperature carrier gas flowed past the structure, so that the sensible heat of the flowing gas stream is employed to maintain the flash vaporization matrix structure at a desired temperature level.

Alternatively, the matrix structure may be provided with a suitable source of heating energy, such as means for infrared (IR) heating of the structure, e.g., an IR lamp disposed proximate to the first fluid flow passage in the vicinity of an IR-transmissive window in the first fluid flow passage, so that radiant IR energy is transmitted therethrough to heat the matrix structure.

Accordingly, the vaporization system shown in FIG. 1 may be usefully employed for vaporization, and specifically flash vaporization, of a wide variety of liquid reagents, e.g., Group II reagents, such as organometallic compounds and complexes of Group II elements, which require delivery in vapor form to a vapor deposition chamber, or other location or environment of use.

By way of specific examples, in the formation of Group II metal fluoride (e.g., $BaF_2/CaF_2/SrF_2$) interlayers, between silicon substrates and HTSC or GaAs overlayers, suitable Group II source reagents may comprise: barium 1,1,1,2,2,3,3,-heptafluoro-7,7-dimethyl-octane-4,6-dionate, sometimes denoted $Ba(fod)_2$; calcium 1,1,1,2,2,3,3-heptafluoro-7,7-dimethyl-octane-4,6-dionate, sometimes denoted (Ca$(fod)_2$; strontium 1,1,1,2,2,3,3-heptafluoro-7,7-dimethyl-octane-4,6-dionate, sometimes denoted $Sr(fod)_2$; and hexafluoroacetylacetonate compounds of barium, calcium, and strontium, in which the foregoing compounds are adducted or complexed with amine(s) or polyamine(s).

In the formation of HTSC films of BiSrCaCuO by MOCVD, wherein the strontium and calcium reagents are introduced as vaporized solutions of the materials, the calcium reagent may be $Ca(fod)_2$ and the strontium reagent may be $Sr(fod)_2$, complexed with a polyamine ligand.

Reagents such as $Ba(fod)_2$; barium hexafluoroacetylacetonate; barium hexafluoroacetylacetonate; 1,2,3,4,5-pentamethyl-1,3-cyclopentadienyl barium; and barium bis (2,2,6,6-tetramethyl-3,5-heptanedionate), when complexed with polyamine coordinating ligands may suitably be employed as Group II reagents for barium in the MOCVD formation of HTSC films of the "123" type ($YBa_2Cu_3O_x$, wherein x is from about 6.0 to about 7.3).

The present invention thus is generally applicable to the delivery of Group II elements from amine or polyamine-complexed Group II beta-diketonate source reagent compounds, including the aforementioned $Ba(fod)_2$, $Ca(fod)_2$, and $Sr(fod)_2$ compounds.

A particularly preferred usage of the amine or polyamine complexes of the present invention is in the formation of thin films of barium strontium titanate (BST), and in such application the use of the amine-adducted or polyamine-adducted source reagent compounds achieves a substantial advance in the art over the use of other complexing agents, such as glyme materials, as described hereinabove.

The amine or polyamine coordinating ligand in the broad practice of the invention may comprise any suitable amine-containing adducting or complexing species, including mono-, di-, tri-, and higher polyamines. Examples of polyamines which may be usefully employed in the practice of the present invention include N, N, N', N", N"-pentamethyldiethylenetriamine (PMDETA), diethylenetriamine (DETA), tetraethylenepentaamine (TEPA), and N, N, N', N", N'", N'"-hexamethyltetraethylenepentaamine (HMTEPA).

The amine-complexed or polyamine-complexed metal β-diketone adducts of the present invention may be provided in liquid form in a solution or suspension containing additional solvent species, e.g., polyamine solvents, or alkanolic solvents, such as isopropanol, butanol, and the like, as more fully described in U.S. patent application Ser. No. 08/484, 654 filed Jun. 7, 1995 in the names of Robin A. Gardiner et al. and U.S. patent application Ser. No. 08/414,504 filed Mar. 31, 1995 in the names of Robin A. Gardiner et al. As an example of the foregoing, the metal β-diketonate compound may comprise a metal-containing compound such as Ba(thd)$_2$ in a solvent mixture of butyl acetate and a polyamine, which will behave similarly to Ba(thd)$_2$ complexed with a polyamine in a butyl acetate solvent. Thus, the polyamine may be present in the compositions of the invention as a coordinating ligand species forming a coordinated complex which is soluble in a solvent medium, as well as being a solvent medium or a component of a solvent medium in which the β-diketonate coordination compound or complex is dissolved or suspended.

Relative to the tetraglyme adducts which have been widely used as coordinating (complexing) ligands in source reagent complexes for various metal β-diketonate compounds, the amine/polyamine complexes of the present invention have been found to possess a significantly higher robustness of vaporization, i.e., the characteristic of vaporizing without significant decomposition. Although as mentioned earlier herein, all source reagent materials are believed to decompose during vaporization to some extent and to produce vaporization decomposition by-products which may over the course of time and continued operation result in clogging or occlusion of the vaporizer structure which is used to volatilize the liquid introduced to the liquid delivery vaporization system.

Such decomposition can be monitored in a liquid delivery process system by measurement of the back pressure of the vaporizer over time. When there is a substantial level of decomposition of the precursor, the vaporizer equipment must correspondingly be shut down and subjected to maintainance to remove the occlusive decomposition by-products which have accumulated in the vaporizer system and reduced its efficiency. Accordingly, the occurrence of substantial decomposition of the source reagent material will correspondingly shorten the active life of the vaporizer system, i.e., the time between successive maintenance events, when the system is shut down and cleaned of the accumulated decomposition solids and involatile liquids.

The present invention therefore provides a substantial advance in the art, in the provision of a metal β-diketonate-based CVD process with significantly increased operating life in the process system between successive maintenance events.

In any given process system involving liquid delivery of source reagent for chemical vapor deposition, the nature and extent of the aforementioned decomposition of the source reagent material is a function of the compositional characteristics and operating conditions of the process, including the nature of the reactant gases, the flow rates involved, wafer temperature, reactor wall temperature in the CVD chamber, pressure conditions, etc.

There also exist hardware differences, so that the same source reagent and CVD process may result in varying levels of decomposition of the source reagent as a result of the construction and arrangement of the apparatus employed to effect the vaporization of the source reagent and deposition of the film growth components of the reagent vapor.

Use of the amine/polyamine complexes of the present invention, in which the metal beta-diketonate compounds are adducted with amine/polyamine ligands, has been surprisingly and unexpectedly found to substantially reduce the levels of decomposition-mediated occlusion of the vaporizer apparatus as monitored by back-pressure measurements. In some instances where the back pressure build-up incident to the liquid delivery reagent vaporization process using tetraglyme adducts of metal beta-diketonate compounds has shown significant increase, e.g., on the order of 2.65 torr/100 ml of source reagent tetraglyme adduct, with wafer throughput (number of wafers coated with thin films of the metal from the source reagent vapor) being on the order of 200–300 wafers between maintenance events (shutdown and cleaning of the vaporizer system), the corresponding use, in the same liquid delivery and vaporization process equipment, of a polyamine adduct source reagent composition of the present invention has resulted in a vastly increased wafer throughput level, on the order of 2000+ wafers, with no significant back pressure build-up.

The features and advantages of the invention are more fully shown with reference to the following illustrative examples.

EXAMPLE I

A PMDETA adduct of barium 2,2,6,6-tetramethylheptanedionate, Ba(thd)$_2$(PMDETA), was evaluated for growth of BaTiO$_3$ in a small (2" substrate) inverted vertical reactor, against a corresponding adduct of tetraglyme. The titanium source compound was Ti(OiPr)$_2$(thd)$_2$.

In comparing the Ba(thd)$_2$(PMDETA) results with the Ba(thd)$_2$(tetraglyme) results, at ordinary vaporizer conditions (~245° C.) and reactor wall temperature (~250° C.), growth rates were about 2700–3000 Å/hr from both compounds, with comparable stoichiometries in the grown films (about 40–45 atomic % Ba, based on the total weight of metal in the film) by both XRF and EDAX).

A comparison set of runs was carried out with reactor wall temperatures 80° C. lower, dropping from 245° C. to 165° C., while holding the vaporizer temperatures constant at 245° C. According to XRF and EDAX, Ba content in the film dropped only slightly to about 38% with the PMDETA adduct, but fell to ~20% with the tetraglyme adduct. The growth rate fell to 1800 Å/hr.

These results indicated that the barium (PMDETA) adduct has a wider temperature window in which it will transport. The barium % in the grown film remained higher for the PMDETA adduct. Little or no reactor wall condensation was visible on the quartz reactor walls with the PMDETA adduct, compared to the tetraglyme adduct.

Because film growth is mass transport limited, condensation of the gas phase reactant on the interior surfaces of the chemical vapor deposition reactor leads to lower deposition rates on the substrate in the reactor. Wall condensation of the precursor in the reactor is undesirable because of reactor memory effects (associated with revolatilization of condensed reagents), particle generation and increased frequency of maintenance of the delivery and deposition system.

The results of this test showed that the polyamine adduct was capable of efficient operation at lower temperatures than required by corresponding tetraglyme adducts. The advantages attendant the reduction of the reactor operating temperature, as permitted by the polyamine precursors of the present invention, include the fact that the reactor may be constructed of materials adapted to such lower temperature. For example, the reactor operating at lower temperature may be constructed with Viton® seals, glass, and other materials which are precluded in reactors operating at higher temperature, thereby reducing the cost and complexity of the reactor.

EXAMPLE II

Figure 2:
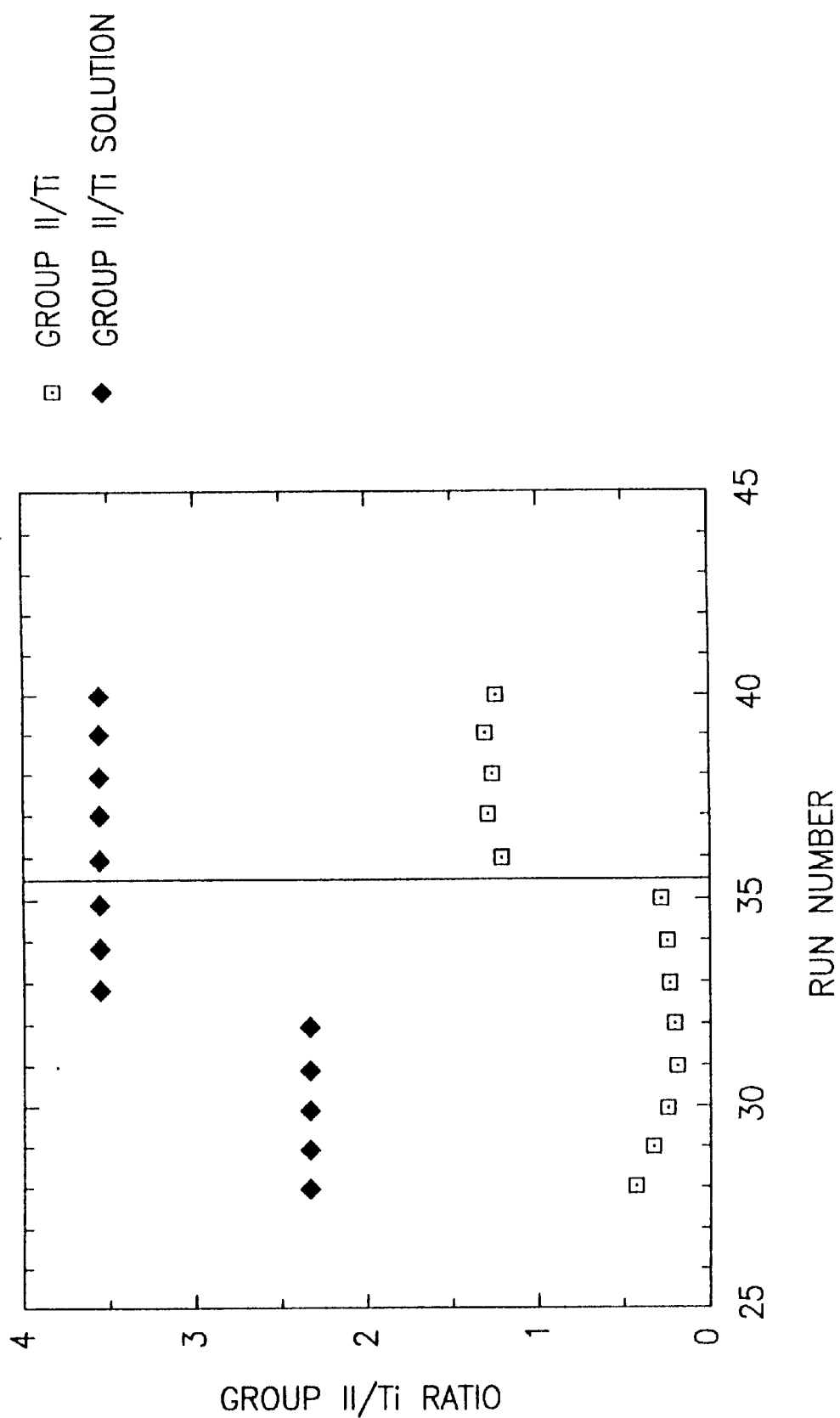
FIG. 2 is a graph of Group II/Ti ratios in films and solutions vs. run number in a liquid delivery vaporization and CVD system, in which at run 36, operation was changed from a tetraglyme precursor to a pentamethyl diethylene triamine (PMDETA) precursor keeping the same solution ratio, with dramatic improvement of the film ratio.

A TEPA adduct of barium thd, Ba(thd)$_2$(TEPA), was tested in the same reactor/material system as in Example I, with Ti(OiPr)$_4$(thd) as the titanium precursor in all runs, and with Sr(thd)$_2$(TEPA) as the strontium precursor. FIG. 2 shows Group II/Ti ratios in the grown films and solutions vs. run number. 25:1 butyl acetate:tetraglyme and 25:1 butyl acetate: Lewis base solvent mixtures were used in the solutions.

Figure 3:
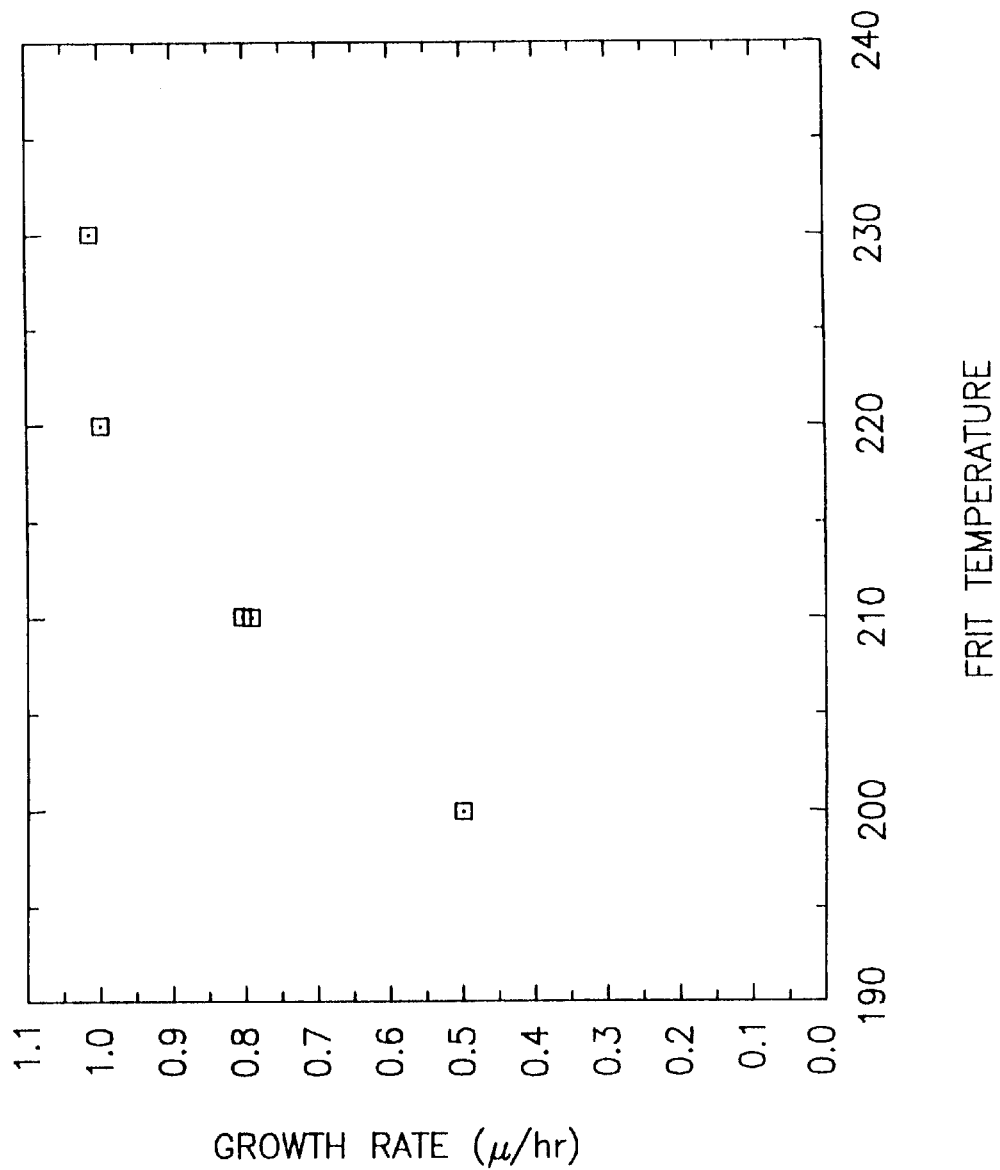
FIG. 3 is a graph of growth rate of BST vs. vaporizer element temperature for a set of PMDETA precursors.

FIG. 3 is a graph of growth rate vs. vaporizer temperature. Operation was commenced with use of the Ba and Sr (thd)$_2$ tetraglyme adducts. Note two points were taken at 210° C. in non-adjacent runs.

In this experiment, a new vaporizer element was installed in the vaporizer at the start of the runs, and when precursors were changed over. At run 36, operation was changed to the corresponding TEPA precursors, Ba(thd)$_2$(TEPA) and Sr(thd)$_2$(TEPA), keeping the same solution ratio as was used for the tetraglyme precursor (70:30). A dramatic improvement in the film stoichiometry resulted (Group II/Ti). The results showed a substantial improvement in the incorporation of the Group II metal into the grown film for the polyamine precursor in accordance with the invention, relative to the tetraglyme precursor of the prior art.

Calculations for this experiment showed that in this system, film incorporation efficiencies for both Ba and Sr roughly doubled upon changing from the tetraglyme adducts to the TEPA adducts. Incorporation efficiencies were low to start (under 1% for Ba, about 2% for Sr), and thus were sub-optimal.

The results show that even for an un-optimized reactor design such as used in this Example, there is a substantial improvement in the use of the polyamine-complexed source reagents of the present invention.

The vaporizer temperature was varied during the TEPA runs between 200° C. and 230° C. without significant stoichiometry change. Growth rate increased with increasing vaporizer temperature.

Set out in Table I below is a listing of run number, temperature, % Ba, %Ti, and %Sr.

| Vaporizer Temperature | Run No. | % Ba | % Sr | % Ti | Group II/Ti ratio |
|---|---|---|---|---|---|
| 200 | 36 | 0.804 | 3.279 | 3.047 | 1.222 |
| 210 | 37 | 1.453 | 4.056 | 4.748 | 1.277 |
| 220 | 38 | 1.871 | 4.259 | 5.87 | 1.273 |
| 230 | 39 | 1.967 | 3.962 | 5.891 | 1.302 |
| 210 | 40 | 1.455 | 3.411 | 4.744 | 1.232 |

EXAMPLE III

The thermal transport of a solution of Ba(thd)$_2$ (PMDETA), at 0.235 M concentration, Sr(thd)$_2$(PMDETA) at 0.107 M concentration and Ti(OiPr)$_2$(thd)$_2$ at 0.258 M concentration was studied. All the runs were conducted using pre-screened 40 µm vaporizing elements with a solution flow rate of 0.08 mL/min. and an Ar flow rate of 200 sccm. The pressure above and below the vaporizing element and the liquid pressure was monitored every minute for ten hours. Run to run reproducibility was measured at 200° C. and was found to be 0.79 Torr/100 mL. At 245° C., essentially no increase in the upstream pressure was observed for the PMDETA solution indicating little or no decomposition of the precursors.

Figure 4:
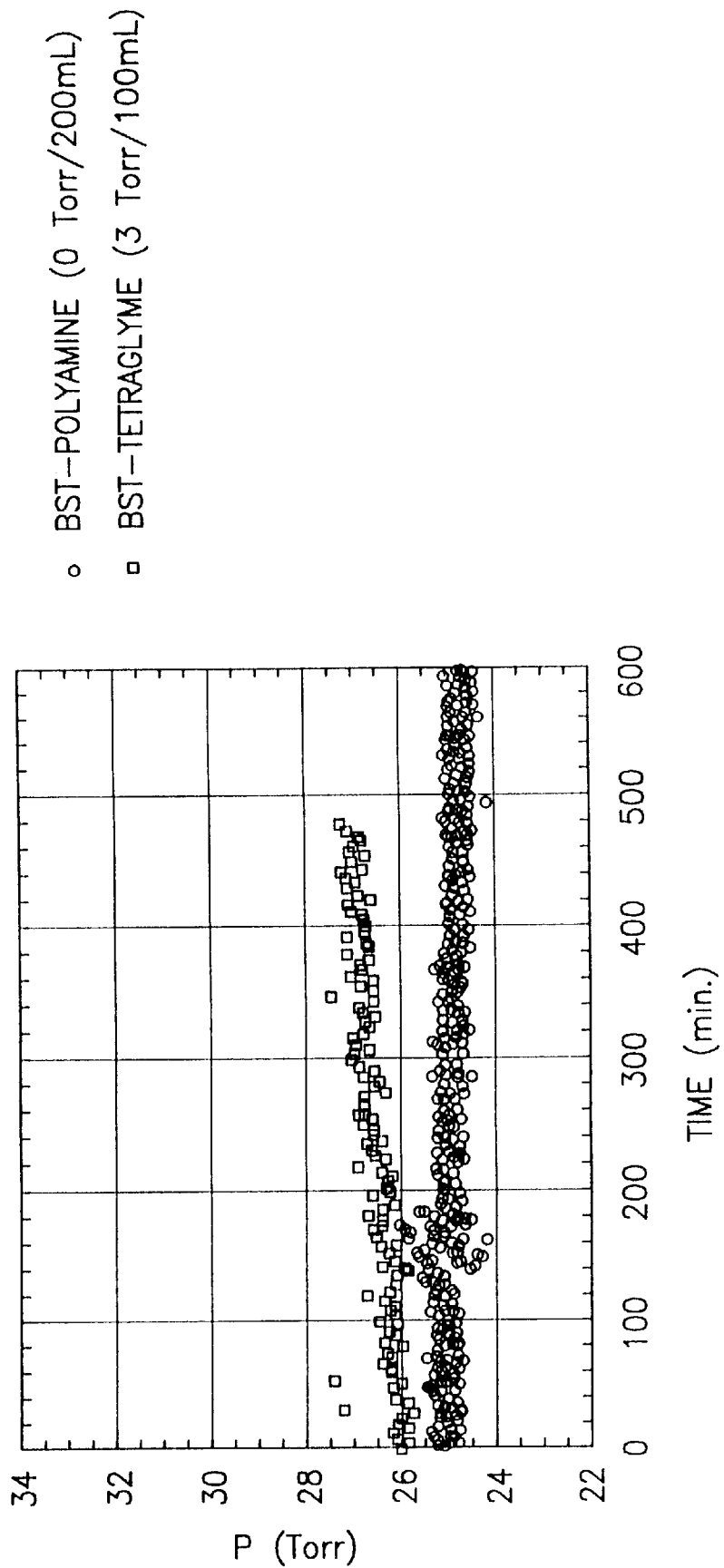
FIG. 4 shows the measured pressure rise above the vaporizing element during "flash" vaporization of tetraglyme (top) and PMDETA (bottom) adducts of $M(thd)_2$ at the following conditions: Ar flow rate=200 sccm, vaporizer temperature=245° C., precursor flow rate=0.08 mL/min.

FIG. 4 shows the measured pressure rise above the vaporizing element during "flash" vaporization of tetraglyme (top) and PMDETA (bottom) adducts of M(thd)$_2$ under the following conditions: Ar flow rate=200 sccm, vaporizer temperature=245° C., and precursor flow rate=0.08 mL/min. A pressure rise of 2.65 torr/100 mL of precursor was measured for the tetraglyme precursors and no measurable pressure rise was found for the PMDETA precursors.

These data show that the different molecular structure and thermochemical properties of the respective precursor mixtures are responsible for the large performance variation observed in these vaporization experiments, and show the striking improvement in performance achievable with the polyamine precursors of the present invention.

Using this same methodology, single precursor solutions were examined over a vaporizer temperature range from 160° C. to 260° C. The change in pressure versus 100 mL total volume of precursor in liquid delivery and vaporization was determined.

Figure 5:
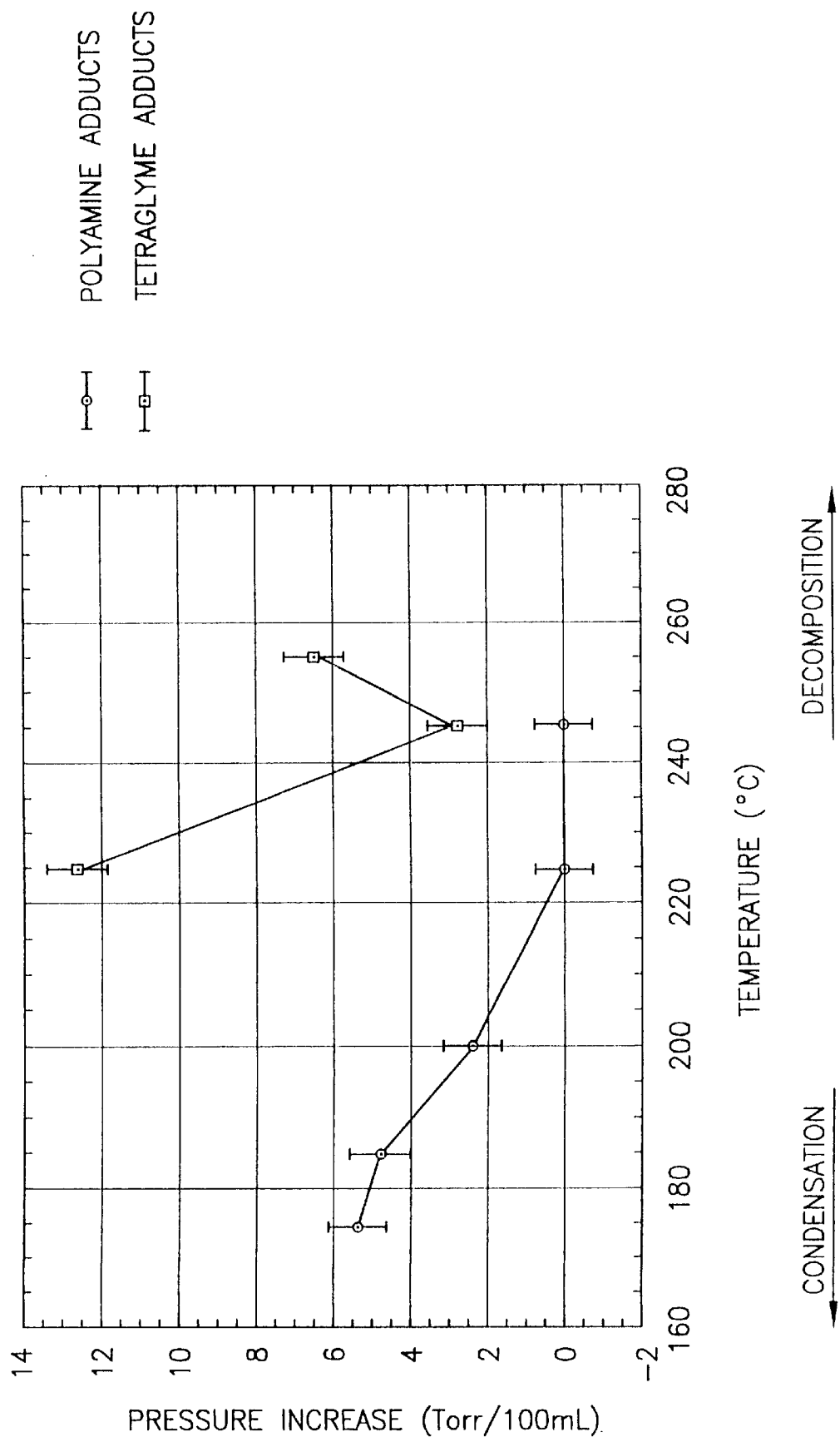
FIG. 5 is a graph of the pressure increase measured per 100 mL total liquid delivery as a function of the vaporizer temperature for tetraglyme (upper right) and PMDETA (lower left) adducts of $M(thd)_2$.

The results are shown in FIG. 5, as a graph of the pressure increase measured per 100 mL total liquid delivery as a function of the vaporizer temperature for the tetraglyme (upper right) and PMDETA (lower left) adducts of M(thd)$_2$. The PMDETA based solution provides a wider vaporization window for BST film growth and CVD applications.

In addition to showing that the vaporization window for PMDETA-based precursors is much larger than the vaporization window for the tetraglyme adducts, the FIG. 5 plot also shows that at low vaporization temperatures, condensation of the precursors occured without subsequent decomposition; the pressure dropped in the vaporizer upon prolonged heating after termination of the liquid flow. At the higher vaporizer temperatures, the pressure did not decrease after flow was terminated, regardless of heating; this was a direct indication of precursor decomposition and was related both to the higher vaporization temperature and longer residence times.

These results indicate that the pressure rise at low vaporizer temperatures was directly related to precursor condensation and precursor decomposition was responsible for the observed pressure rise at the higher temperatures.

Figure 6:
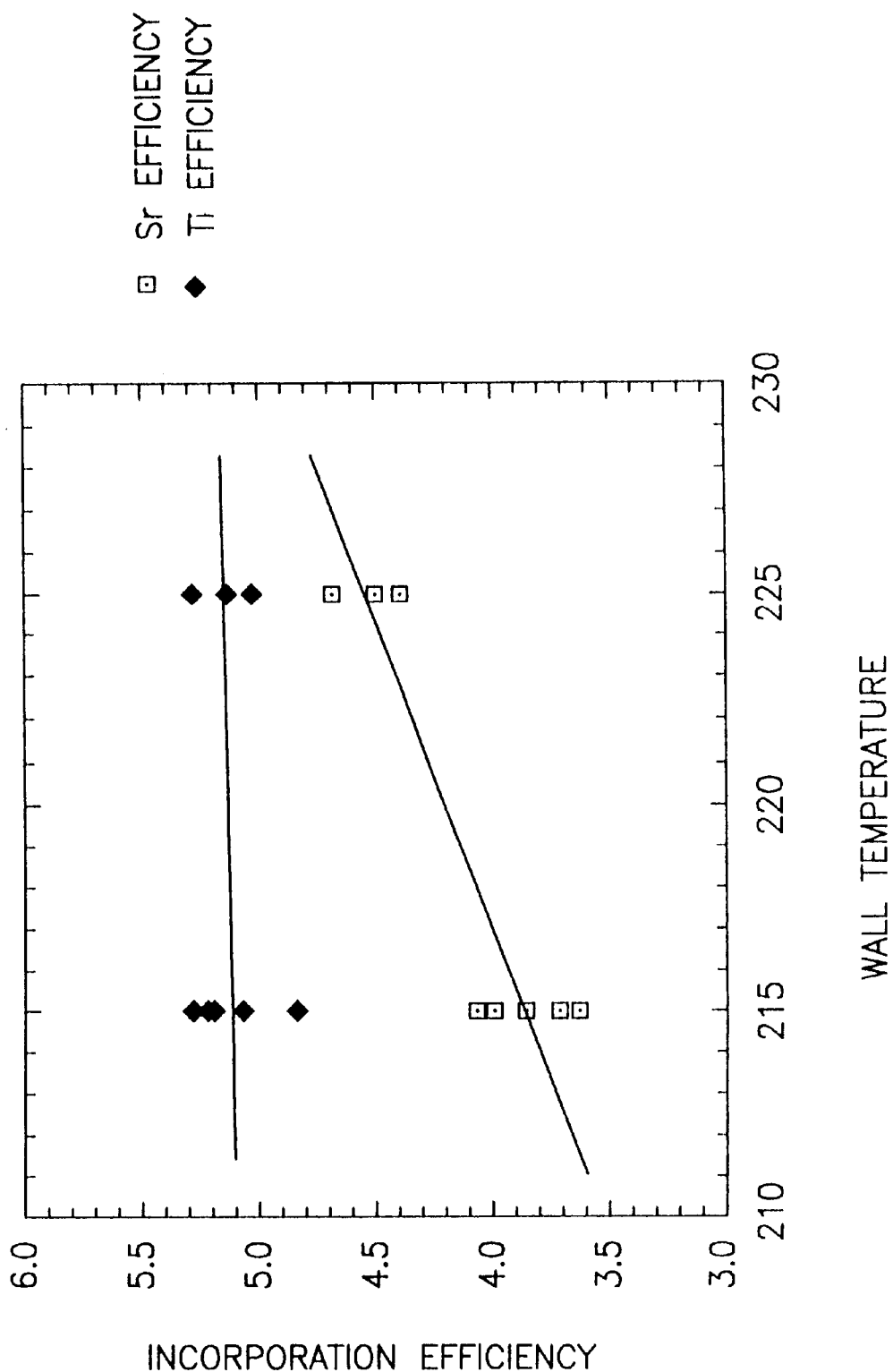
FIG. 6 shows a plot of incorporation efficiencies of Sr (from a polyamine-based precursor) and Ti in BST films grown in a Watkins-Johnson CVD reactor as a function of wall temperature, with vaporizer temperature held constant at 210° C.

FIG. 6 shows a plot of incorporation efficiencies of Sr (from a PMDETA-based precursor) and Ti in BST films grown in a Watkins-Johnson CVD reactor as a function of wall temperature, with vaporizer temperature held constant at 210° C.

There is about a 20% falloff in incorporation with wall temperature dropping from 225° C. to 215° C., though some of this may be due to different gas dynamics in the mixing and reactor chambers with respect to the varied temperature. Raising wall temperature from 220° C. to 230° C. while holding vaporizer temperature constant (higher than the temperature employed in the experiment for which data is shown in FIG. 6) suggests that efficiency is reduced at higher wall temperatures.

EXAMPLE IV

Figure 7:
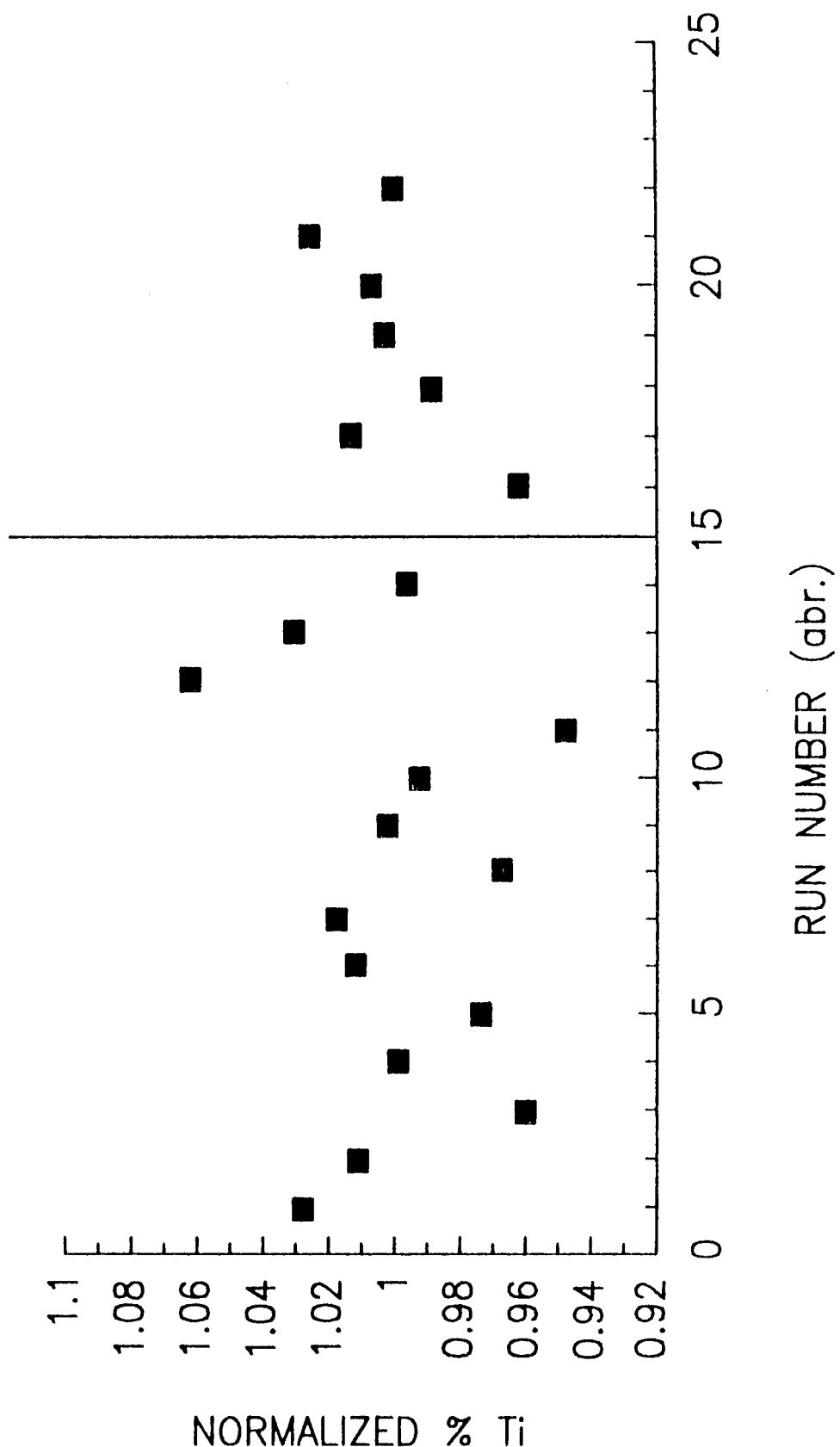
FIG. 7 is a plot of process data showing run-to-run reproducibility, plotted as normalized % Ti in BST films grown with conventional tetraglyme-complexed precursors (left side of vertical line) and with triamine-complexed precursor (right side of vertical line).

FIG. 7 is a plot of process data showing run-to-run reproducibility. Normalized % Ti in BST was plotted as a function of the run number, for films grown with conventional tetraglyme-complexed precursors (left side of vertical line) and with PMDETA-complexed precursor (right side of vertical line).

In comparing conventional tetraglyme adducts and polyamine adducts of the present invention, in respect of the reproducibility of delivery with polyamine Group II precursors, compared to conventional tetraglyme precursors, Ti content of the grown films is utilized as an indicator.

The film Ti content is a direct way of comparing the films produced by use of the respective precursors, since the remainder of the deposited film is made up of Group II elements. Comparing the run-to-run reproducibility in % Ti in BST films from several sets of runs for tetraglyme precursors, with that for polyamine precursors, similar results are shown in FIG. 7. The standard deviation in run-to-run composition for the standard precursors is 3%, and for the polyamine is 2%.

EXAMPLE V

Using a solution comprised of Ba(thd)$_2$(PMDETA), Sr(thd)$_2$(PMDETA), and Ti(OiPr)$_2$(thd)$_2$, the MOCVD of BST thin-films was examined on 6" substrates in a modified Watkins-Johnson reactor. Ba$_x$Sr$_{1-x}$TiO$_3$ films (600 Å thick) were deposited and compared with those obtained from a solution of tetraglyme adducts under identical process conditions.

The CVD results demonstrated comparable stoichiometric reproducibility between the two precursor systems, with a run-to-run standard deviation of about ±2% in this reactor. Dielectric constants and leakage currents were also compared; comparable or better results were obtained with the PMDETA precursors. Dielectric constants for the specific BST stoichiometry and sample thickness deposited were near 200, while leakage at 1 V was $2.5 \times 10^{-9}$ A/cm$^2$. For Ba(thd)$_2$(PMDETA), less condensation on "unheated" reactor walls was observed when directly compared to Ba(thd)$_2$(tetraglyme). Film morphologies by scanning electron micrograph were nearly identical for the two precursor solutions; under identical film growth processes, the deposited films were relatively smooth with no particle formation noted.

The electrical properties of the films produced by the respective tetraglyme and the PMDETA precursors were generally consistent with one another, including dielectric constant, so long as the titanium incorporated was maintained at about 51 atomic percent in the deposited film. At higher titanium concentration values the performance deteriorated.

Figure 8:
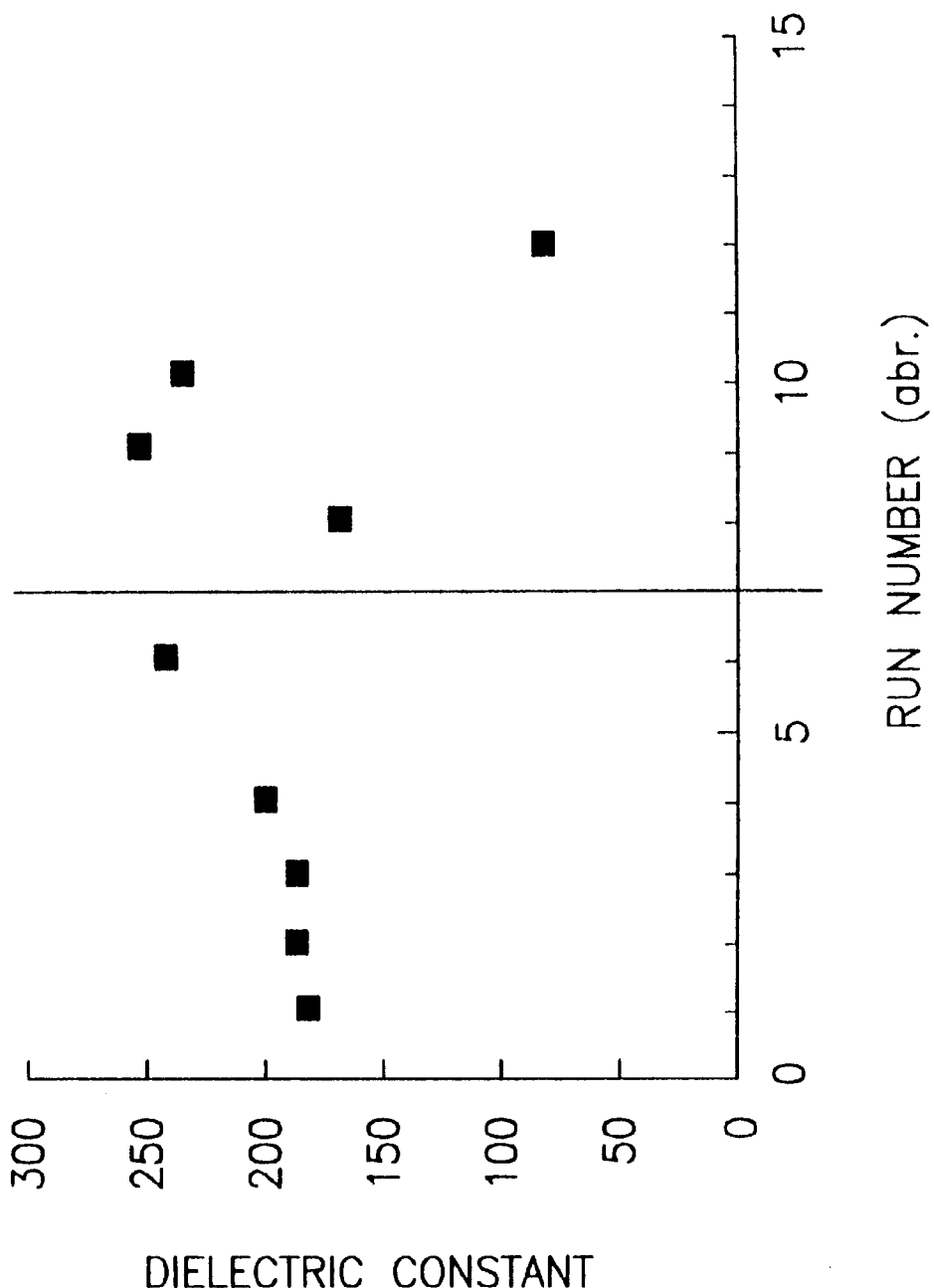
FIG. 8 is a graph of dielectric constants for standard tetraglyme and polyamine based precursors.

FIG. 8 is a plot of dielectric constants of BST thin films formed from a tetraglyme adduct (on the left-hand side of the vertical line in the plot) and BST thin films formed from polyamine adduct (on the right-hand side of the vertical line in the plot). Polyamine precursor-produced films exhibited about the same dielectric constant, e, as were produced in films from tetraglyme-complexed adducts, viz., ~200. Dielectric constant as a function of Ti content showed no strong trend except above about 56% Ti, in which regime the dielectric constant drops to near 20.

Leakage currents were measured between ±1 and 3 volts for BST films. They ranged between $10^{-8}$ to $10^{-12}$, and for 3 volts they ranged between $10^{-9}$ and $10^{-9}$.

Leakage was also examined for BST films as a function of Ti content, for BST films produced from conventional precursors and from polyamines. Both films showed comparable levels of leakages.

To summarize the polyamine-based precursor electrical results, both dielectric constant and leakage of BST films produced from polyamine-based precursors (with their attendant process advantages) were comparable to the dielectric constant and leakage electrical properties of BST films made using conventional tetraglyme precursors. Such electrical properties are suitable for a wide variety of integrated capacitors, specifically dynamic random access memory devices (DRAMs), as well as for other integrated and discrete thin film-based passive devices.

The polyamine adducts of the present invention, e.g., metal β-diketonate triamine adducts as discussed and exemplified herein, have a much broader temperature-vaporization window extending the range of vaporizer and reactor wall temperatures to lower levels than the corresponding adducts (metal β-diketonate tetraglyme adducts) previously used in the art, making the chemical vapor deposition process more robust, and more commercially viable.

The improved temperature-vaporization window is achieved by use of the polyamine-based precursor compositions of the present invention, which yield film growth rates and electrical film properties comparable to those of films produced with prior art tetraglyme-based precursors. As a result of the improved temperature-vaporization window characteristic of the use of polyamine-based precursors of the present invention, the polyamine-based precursors of the invention are highly advantageous for liquid delivery MOCVD formation of films, e.g., barium titanate and barium strontium titanate films.

What is claimed is:

1. A method of forming a barium- and/or strontium-containing film on a substrate from corresponding precursor (s), comprising liquid delivery and flash vaporization thereof to yield a precursor vapor at a temperature below about 210° C., and transporting the precursor vapor to a chemical vapor deposition reactor for formation of a corresponding barium- and/or strontium-containing film on the substrate, wherein the precursor(s) have the formula:

$$MA_yX$$

wherein:

M is barium or strontium;

A is a monodentate or multidentate organic ligand coordinated to M which allows complexing of MA$_y$ with X;

y is an integer having a value of 2, 3 or 4;

each of the A ligands is the same or different; and

X is a monodentate or multidentate amine or polyamine ligand coordinated to M.

2. A method according to claim 1, wherein the film is Ba$_x$Sr$_{1-x}$TiO$_3$ and x is from 0 to 1, inclusive.

3. A method according to claim 1, wherein the film is barium strontium titanate, and said method additionally comprises liquid delivery, flash vaporization and transport of a titanium precursor.

4. A method according to claim 3, wherein the titanium precursor comprises an alkoxide β-diketonate titanium precursor.

5. A method according to claim 4, wherein the alkoxide β-diketonate titanium precursor is Ti(OiPr)$_2$(thd)$_2$.

6. A method according to claim 1, wherein A is selected from the group consisting of β-diketonates, β-thioketonates, cyclopentadienyls, alkyls, perfluoroalkyls, alkoxides, perfluoroalkoxides, and Schiff bases.

7. A method according to claim 1, wherein A is selected from the group consisting of:

(i) 2,2,6,6-tetramethyl-3,5-heptanedionate;

(ii) 1,1,1,5,5,5-hexafluoro-2,4-pentanedionate;

(iii) 1,1,1,2,2,3,3-heptafluoro-7,7-dimethyl-4,6-octanedionate;

(iv) cyclopentadienyl;

(v) 4,4'-(ethane-1,2-diyldiimino) bis (3-pentene-2-one);

(vi) pentamethylcyclopentadienyl and other substituted cyclopentadienyls;

(vii) 2,4-pentanedionate; and (viii) 1,1,1-trifluoro-2,4-pentanedionate; and (ix) 2,2,7-trimethyl-3,5-octanedionate.

8. A method according to claim 1, wherein X is selected from the group consisting of pentamethyldiethylenetriamine (PMDETA), diethylenetriamine (DETA), tetraethylenepentaamine (TEPA) and hexamethyltetraethylene-pentaamine (HMTEPA).

9. A method according to claim 1, wherein X is a polyamine.

10. A method according to claim 1, wherein X is selected from the group consisting of PMDETA and TEPA.

11. A method according to claim 1, wherein: A is a β-diketonate; and X is selected from the group consisting of PMDETA, DETA, HMTEPA, and TEPA.

12. A method according to claim 1, wherein the film is barium strontium titanate, and the barium and strontium precursors are selected from the group consisting of Ba(thd)$_2$(TEPA), Ba(thd)$_2$(PMDETA), Sr(thd)$_2$(TEPA), and Sr(thd)$_2$(PMDETA).

13. A method according to claim 1, wherein the film is barium strontium titanate, and the barium and strontium precursors are Ba(thd)$_2$(PMDETA) and Sr(thd)$_2$(PMDETA).

14. A method according to claim 1, wherein the film is barium strontium titanate, and the barium and strontium precursors are Ba(thd)$_2$(TEPA) and Sr(thd)$_2$(TEPA).

15. A method according to claim 1, wherein the metalorganic complex MA$_y$ or MA$_y$X is dissolved in a solution of organic solvent and polyamine.

16. A method according to claim 15, wherein the polyamine is selected from the group consisting of PMDETA, DETA, HMTEPA, and TEPA, and mixtures thereof.

17. A method according to claim 15, wherein the polyamine comprises a mixture of polyamine compounds.

18. The method according to claim 1 wherein the flash vaporization is performed at a temperature below about 200° C. to yield a precursor vapor.

19. The method according to claim 1 wherein the flash vaporization is performed at a temperature below about 190° C. to yield a precursor vapor.

20. A method of forming a barium- and/or strontium-containing film on a substrate from corresponding precursor(s), comprising the steps of:

providing the precursor(s) in a solvent or suspending agent therefor, as a liquid reagent composition comprising the precursor(s) and the solvent or suspending agent;

vaporizing the liquid reagent composition to yield a precursor vapor at a temperature below about 210° C., and transporting the precursor vapor to a chemical vapor deposition reactor having the substrate therein; and depositing a corresponding barium- and/or strontium-containing film on the substrate, wherein the precursor(s) have the formula:

$$MA_yX$$

wherein:

M is barium or strontium;

A is a monodentate or multidentate organic ligand coordinated to M which allows complexing of MA$_y$ with X;

y is an integer having a value of 2, 3 or 4;

each of the A ligands is the same or different; and

X is a monodentate or multidentate amine or polyamine ligand coordinated to M.

21. A method according to claim 20, wherein A is selected from the group consisting of: β-diketonates, β-thioketonates, β-ketoiminates, β-diiminates, C$_1$–C$_8$ alkyl, C$_2$–C$_{10}$ alkenyl, C$_2$–C$_{15}$ cycloalkenyl, C$_6$–C$_{10}$ aryl, C$_1$–C$_8$ alkoxy, and fluorinated derivatives thereof.

22. A method according to claim 20, wherein the liquid precursor material comprises a multi-component solution including Ba and Sr metalorganic complexes of said formula MA$_y$X.

* * * * *